(12) United States Patent
Nishimura et al.

(10) Patent No.: US 7,272,200 B2
(45) Date of Patent: Sep. 18, 2007

(54) PHASE SHIFTER, PHASE SHIFTING METHOD AND SKEW COMPENSATION SYSTEM FOR HIGH-SPEED PARALLEL SIGNALING

(75) Inventors: Shinji Nishimura, Koganei (JP); Katsuyoshi Harasawa, Ninomiya (JP)

(73) Assignees: Hitachi, Ltd., Tokyo (JP); Hitachi Hybrid Network Co., Ltd., Kanagawa (JP)

( * ) Notice: Subject to any disclaimer, the term of this patent is extended or adjusted under 35 U.S.C. 154(b) by 719 days.

(21) Appl. No.: 10/736,515

(22) Filed: Dec. 17, 2003

(65) Prior Publication Data

US 2004/0125902 A1    Jul. 1, 2004

(30) Foreign Application Priority Data

Dec. 24, 2002  (JP)  ............................. 2002-371302

(51) Int. Cl.
 *H04L 7/00*   (2006.01)
 *H04L 27/08*  (2006.01)
(52) U.S. Cl. ...................................... 375/354; 375/345
(58) Field of Classification Search ................ 375/354, 375/355, 371, 340, 344–346, 316; 714/700
See application file for complete search history.

(56) References Cited

U.S. PATENT DOCUMENTS 5,175,514 A * 12/1992 Iinuma et al. ............... 332/103
5,719,862 A *  2/1998 Lee et al. .................... 370/355
5,742,798 A *  4/1998 Goldrian .................... 713/400

(Continued)

FOREIGN PATENT DOCUMENTS

JP   9-69829    8/1995
JP   10-200401  12/1996

(Continued)

OTHER PUBLICATIONS

A. Takai, T. Kato, S. Yamashita, S. Hanatani, Y. Motegi, K. Ito, H. Abe and H. Kodera, "200-Mb/s/ch 100-m Optical Subsystem Interconnections Using 8-Channel 1.3 μm Laser Diode Arrays and Single-Mode Fiber Arrays", Journal of Lightwave Technology, vol. 12, No. 2, Feb. 1994, pp. 260-270.

*Primary Examiner*—Mohammed Ghayour
*Assistant Examiner*—Vineeta Panwalkar
(74) *Attorney, Agent, or Firm*—Reed Smith LLP; Stanley P. Fisher, Esq.; Juan Carlos A. Marquez, Esq.

(57) ABSTRACT

The invention intends to realize a high accuracy of some picoseconds in skew compensation as well as a downsized circuit scale. A phase shifter using analog circuits that allows a downsized circuit scale and a high-accuracy phase shifting is adopted in order to finely shift the phase between a clock signal and a data signal. The phase shifter passes the clock signal or the data signal through a low pass filter having a pass band not higher than the based frequency of the clock signal to extract the frequency factors not higher than the based frequency factors. After dividing the extracted signal into plural signals, the phase shifter inputs the clock signal or the data signal having the phase shifted to plural variable gain amplifiers. Next, the phase shifter inputs the outputs from the variable gain amplifiers to an adder or a subtracter, and inputs the signal after being added or subtracted to a limit amplifier to reshape it into a rectangular wave. Thus, by analogically adjusting the outputs from the variable gain amplifiers, the phase shifter shifts the phase of the input clock signal or data signal.

17 Claims, 11 Drawing Sheets

U.S. PATENT DOCUMENTS

| | | | |
|---|---|---|---|
| 6,079,035 A * | 6/2000 | Suzuki et al. | 714/700 |
| 6,757,334 B1 * | 6/2004 | Feher | 375/259 |
| 2002/0131105 A1 * | 9/2002 | Herrity | 359/124 |
| 2003/0046618 A1 * | 3/2003 | Collins | 714/700 |
| 2003/0102911 A1 * | 6/2003 | Raghavan et al. | 330/124 R |
| 2003/0223587 A1 * | 12/2003 | Nishi | 380/284 |

FOREIGN PATENT DOCUMENTS

| | | |
|---|---|---|
| JP | 10-320074 | 5/1997 |
| JP | 11-313051 | 4/1998 |
| JP | 2000-101554 | 9/1998 |

* cited by examiner $V = A\sin\omega t + B\sin(\omega t - \frac{\pi}{2})$ (1) A=1, B=0
(2) A=1, B=0.5
(3) A=1, B=1
(4) A=0.5, B=1
(5) A=0, B=1
(6) A=-0.5, B=1
(7) A=-1, B=1
(8) A=-1, B=0.5

$V = A\sin\omega t + B\sin(\omega t - \frac{\pi}{2})$ (1) A=1, B=0
(2) A=1, B=0.5
(3) A=1, B=1
(4) A=0.5, B=1
(5) A=0, B=1
(6) A=-0.5, B=1
(7) A=-1, B=1
(8) A=-1, B=0.5

PHASE SHIFTER, PHASE SHIFTING METHOD AND SKEW COMPENSATION SYSTEM FOR HIGH-SPEED PARALLEL SIGNALING

FIELD OF THE INVENTION

The present invention relates to an electronic circuit device that compensates (makes re-timing for) a propagation time difference (skew) between parallel synchronizing data and a clock signal inside a high-performance network apparatus and a computer system.

BACKGROUND OF THE INVENTION

A parallel optical link is effective in use for expanding the capacity of data connections inside and between the devices contained in a high-performance network apparatus and a computer system. The parallel optical link relates to the connections by a short distance data communication inside and between the devices, and to the communication technology that transmits signals, by driving in parallel optical signal transmission systems composed of optical signal-emitting elements, optical signal-receiving elements, and optical fibers. A use of the parallel optical link will achieve a large throughput data communication connection on a small device scale with a low delay.

To synchronously communicate a large throughput of signals in parallel by using the parallel optical link, it is necessary to compensate the skew between both channels of parallel data and a clock, and to maintain the signal synchronism between the parallel channels. The conventional computer system employs mainly two techniques for the skew compensation between the parallel signals inside the system. One is to compensate a low skew (less than one clock cycle) between the clock and the data by using delay elements and so forth, and the other one is to compensate a high skew (more than one clock cycle) by using logic circuits called the framed synchronization.

The invention belongs to the technique that compensates the low skew between the clock and the data with a high accuracy. The broadband orientation in the data communication accompanies an extraordinary acceleration of the clock speed, and in the year of 2002, the data communication is in the practical use at the clock speed of 10 gigabits per second. The invention is on the premise that it is applied to a large capacity communication using such an extraordinary high-speed clock as 10 gigabits per second.

The following four techniques have been disclosed so far, which compensate the skew between the clock and the data. The first one is to adjust the delay time of the data by means of a multistage gate circuit; the second one is to use a flip-flop circuit; the third one is to use a phase-locked loop circuit; and the fourth one is to shift the phase by means of a differential or integral circuit.

The first technique using the multistage gate circuit is disclosed in the Japanese Patent No.3127882. This technique inputs the data to the multistage gate circuit, and controls a selector to select the output to thereby adjust the skew between the clock and the data.

The second technique using the flip-flop circuit is disclosed in the Japanese Patent Laid-Open No. H10-320074, and in the IEEE Journal of Lightwave Technology, Vol. 12, page 260 to page 270, by Astushi Takai, et al. The Japanese Patent Laid-Open No. H10-320074 employs the circuit system that controls multistage delay lines by a shift register, latches the data signal by two clocks with 180° phase difference, and outputs to select the data signal in the appropriate phase relation. The method that Astushi Takai, et al. reported in the IEEE Journal of Lightwave Technology uses a single stage flip-flop circuit, and latches the data signal by the clock to thereby control the phase between the data and the clock.

The third technique using the phase-locked loop circuit is disclosed in the Japanese Patent Laid-Open No. H10-200401. This technique of adjusting the skew between the clock and the data by using the phase-locked loop circuit or the clock/data recovery circuit having the similar circuit configuration is generally employed in the Ethernet (trademark) and the ATM communication.

The fourth technique using the differential or integral circuit is disclosed in the Japanese Patent Laid-Open No. 2000-101554 and Japanese Patent Laid-Open No. H9-69829. The Japanese Patent Laid-Open No. 2000-101554 possesses the circuit configuration that judges the phase of the clock factor signal extracted from the base clock signal and the received data signal on the basis of the output from the integral circuit. The Japanese Patent Laid-Open No. H9-69829 uses a lowpass filter on the transmitter side, transmits to restrict the frequency factors of the clock signal, and attains the phase shifting. The differential/integral circuit is called the LCR circuit in general, which is capable of shifting the phase analogically by appropriately setting the values of three lumped constant elements of the inductor L, capacitor C, and resistor R.

SUMMARY OF THE INVENTION

The invention intends to achieve the skew compensation method that satisfies both the enhancement of accuracy in the skew compensation and the miniaturization of the circuit scale, in the circuit that synchronizes and compensates the low skew (less than one clock cycle) between the clock and the data.

In such a large-throughput communication as some 10 gigabits per second being the objective of the invention, it is advantageous in view of the cost to take on the method that employs the high-speed data transmission circuit capable of handling 10 gigabits per second in parallel in order to realize a large-throughput parallel synchronized data transmission in the communication.

In the clock speed of 10 gigabits per second, the clock cycle is 100 picoseconds, which is extremely short. Therefore, the adjustment of the skew between the clock and the data needs the skew compensation accuracy with as high resolution and adjustment accuracy as about 5% of the clock cycle, namely, 5 picoseconds. Further, the lowering of the device and system cost needs the miniaturization and the reduction of number of parts by circuit integration; accordingly, it becomes necessary to integrate the related circuits and downsize the scale of them. As a concrete example, to realize the data transmission of 100 gigabits per second needs to use 10 channels of the data transmission system of 10 gigabits per second in parallel. In this case, the communication LSI making up the device system needs to integrate more than 10 channels (desirably, 100 channels) of the data channel of 10 gigabits per second into one chip. Therefore, the circuit scale is preferred as small as possible.

There are four conventional techniques reported as mentioned above, which compensate the skew between the clock and the data; however, they have problems in either the skew compensation accuracy or the circuit scale. There does not exist a technique that meets both the skew compensation accuracy of some picoseconds and the miniaturization of circuit scale that effects integration of the related circuits of more than 100 channels, which this invention requires.

In the method using the multistage gate circuit reported in the Japanese patent No. 3127882, the delay per one stage of the amplifier/gate circuit is at least some 10 picoseconds; and in case of controlling the delay with the amplifier/gate combined in multiple stages, the accuracy is impossible of falling below the delay per one stage of the amplifier/gate (some 10 picoseconds). Therefore, it is difficult to realize the skew compensation accuracy of some picoseconds that this invention requires.

In the method using the flip-flop circuit reported in the Japanese Patent Laid-Open No. H10-320074 and the IEEE Journal of Lightwave Technology, Vol. 12, page 260 to page 270, by Atsushi Takai, et al., the time span within which the skew compensation can be made is extremely narrow. The flip-flop circuit does not permit the transition of data signals (change from 0 to 1 or from 1 to 0) between the setup time of the clock and the hold time. Accordingly, the method is not substantially able to compensate the skew to the data signals whose transition timings fall in the time span of about 50% of the clock cycle (totaling the setup time and the hold time, 50 picoseconds in the signal of 10 gigabits per second); and it is only able to compensate the skew to the remaining data signals within about 50 picoseconds, which is very narrow. The invention assumes that the skew between the clock and the data takes an arbitrary size within one clock cycle, and the method using the flip-flop circuit cannot be accepted.

The method using the phase-locked loop circuit reported in the Japanese Patent Laid-Open No. H10-200401 is able to compensate the skew between the clock and the data with a very high accuracy less than some picoseconds. However, the phase-locked loop circuit bears the circuit scale of some ten times compared to that of the gate delay circuit or the flip-flop circuit, accordingly the circuit is unsuitable to the application that needs to integrate multiple pieces of it.

The method using the analog LCR circuit reported in the Japanese Patent Laid-Open No. 2000-101554 and Japanese Patent Laid-Open No. H9(1997)-69829 needs the inductor and capacitor having a large element size, and accordingly the circuit scale becomes large compared to that of the gate delay circuit or the flip-flop circuit, which is unsuitable to integration. Further, the variable control of the delay is essential to the skew adjustment, and to perform the variable control with the LCR elements involves the variable control of the characteristic values of the passive elements (LCR). However, it is difficult to control the characteristic values of the passive elements with a high accuracy at a fast response speed. Therefore, it is inappropriate to use the analog LCR circuit for the skew control of the high-speed signals.

The present invention has been made in view of the aforementioned problems of the conventional techniques.

According to one aspect of the invention, the method of shifting a phase of an input signal divides the input signal into a first signal and a second signal, gives a phase difference between the first signal and the second signal, and when adding the first signal and the second signal to attain an output signal, controls the amplitudes of the first signal and the second signal to thereby shift the phase of the output signal. The method uses the low frequency factor of the clock signal or the data signal as the input signal, forms a rectangular wave from the output signal, and thereby adjusts the phase of the clock signal or the data signal.

To illustrate a concrete circuit configuration, the invention employs analog amplifiers in parallel, controls the outputs from the amplifiers, and thereby controls the phase of the data signal or the clock signal. The circuit passes the clock or the data signal through a low pass filter to eliminate the frequency factors higher than the carrier clock factor (for example, in case of a signal of 10 gigabits per second, 10 giga Hertz is the carrier clock factor).

A signal passed through the low pass filter is divided and the divided signals are inputted to amplifiers having different delays. The amplifiers themselves may have different delays; or, a delay circuit or a phase shifter may be inserted in series to the amplifier. The outputs from the amplifiers are added again, and the added signal passes through a limit amplifier and the like to be re-shaped into a rectangular wave. Here, it is possible to minutely analogically control the phase of the added and outputted signal by controlling the outputs from the amplifiers.

The outputs from the amplifiers are variably controllable at a high speed continuously without a level, which allows the phase control with an accuracy of some picoseconds that the application of this invention requires, and which is sufficiently applicable to a high-speed signal circuit. Further, the circuit scale is remarkably small because the circuit configuration is possible with four small amplifiers at the minimum, and it is easy to integrate some 100 units of the circuit into an LSI. In this manner of adopting the circuit configuration combined with amplifiers and gates, a skew compensation system with a high accuracy and a downsized circuit scale is realized.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Embodiment 1

Figure 2:
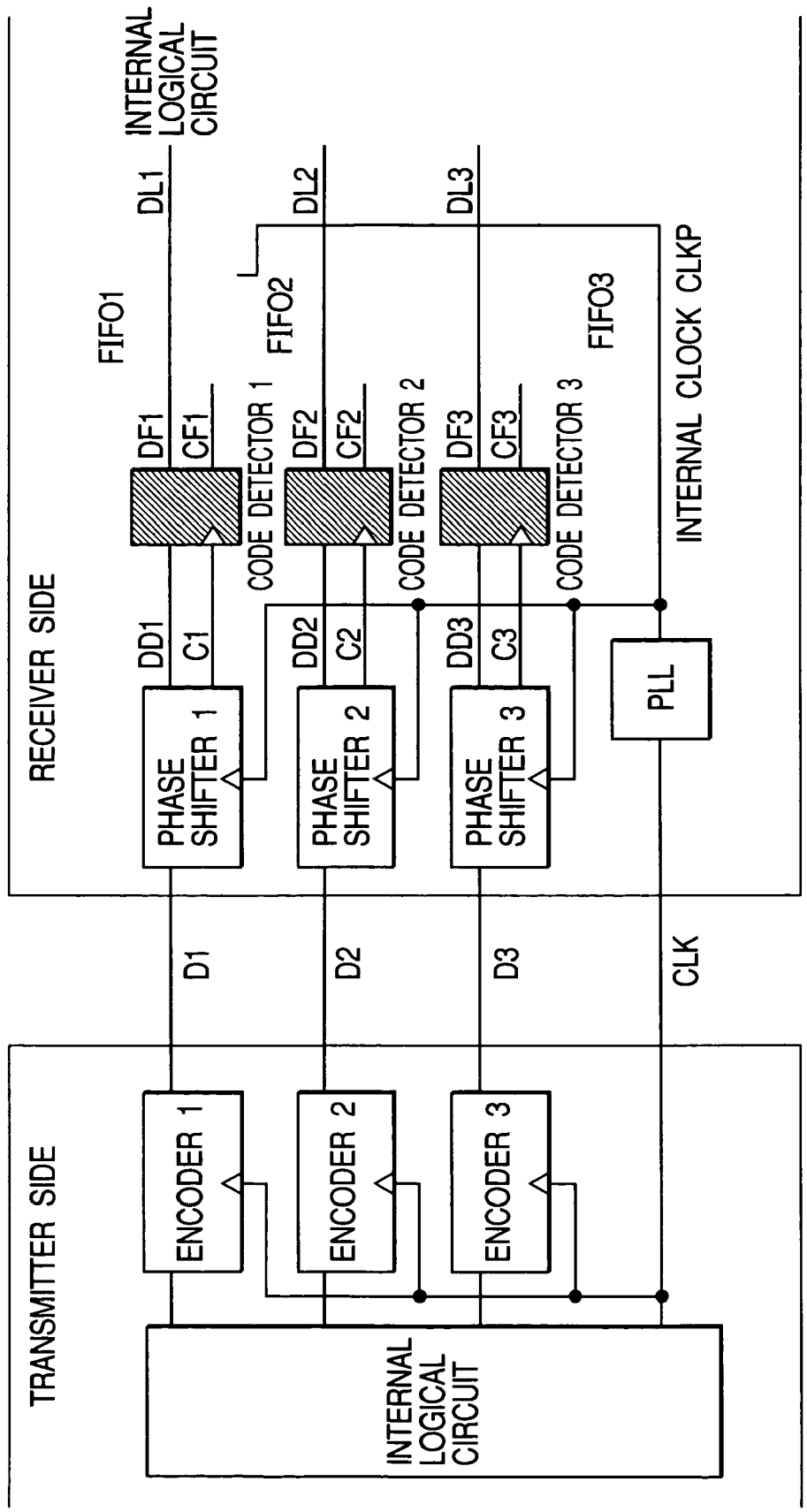
FIG. 2 is a block diagram illustrating one example of the data communication system that incorporates a skew compensation system for parallel optical link based on the invention.
Figure 3:
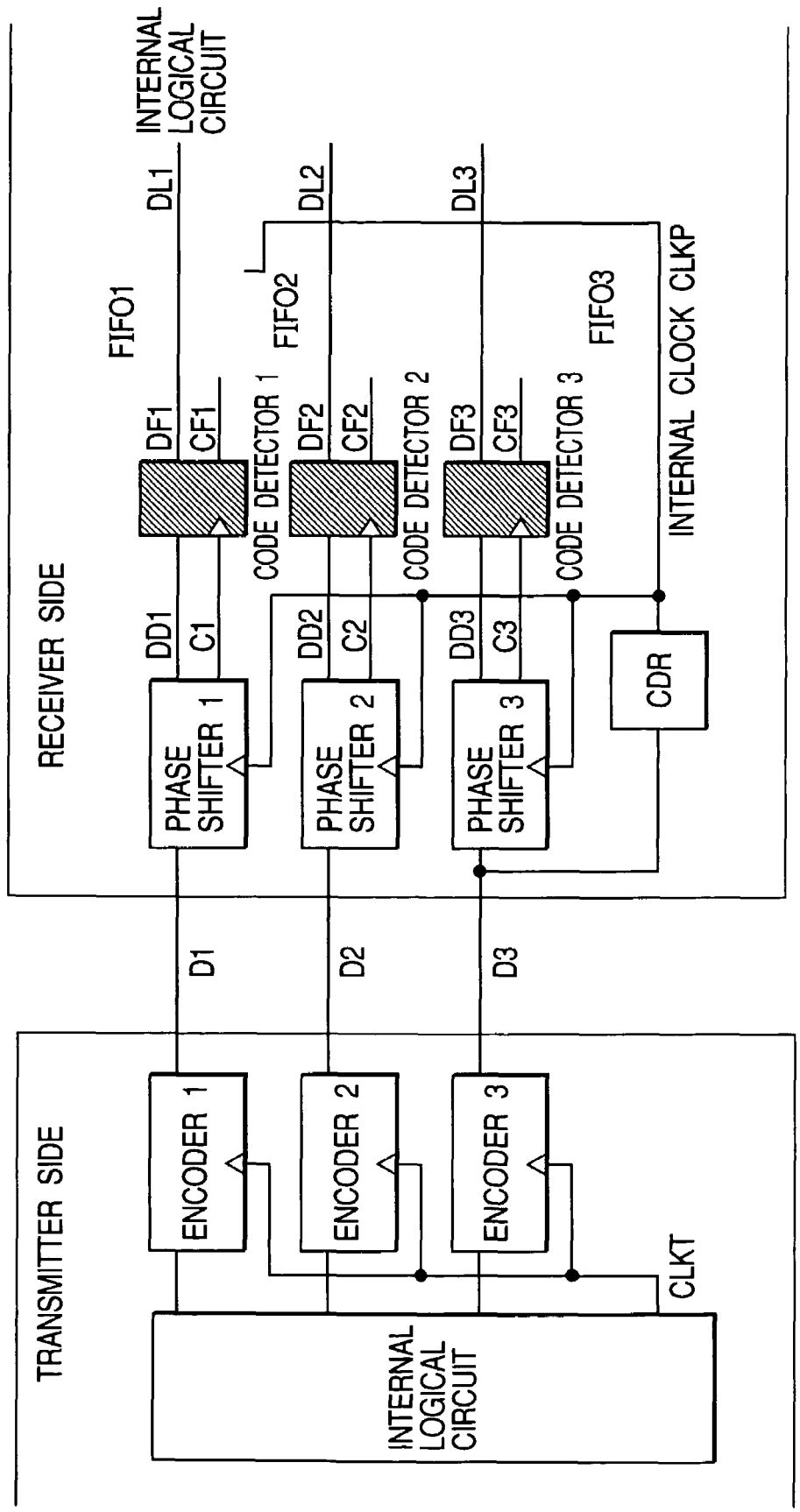
FIG. 3 is a block diagram illustrating another example of the data communication system that incorporates a skew compensation system for parallel optical link based on the invention.

The preferred embodiment will be described in detail with reference to the accompanying drawings. In the following embodiment, the descriptions will be made with concrete numerical values for a quick understanding, however these numerical values are only for examples, and naturally these values will not restrict the invention at all. FIG. 2 illustrates a block diagram of the data communication system (communication with three channels for data and one channel for carrier clock) that incorporates a skew compensation system for parallel link. FIG. 3 illustrates a block diagram of the data communication system (communication with three channels for data) that incorporates a skew compensation system for parallel link.

FIG. 2 illustrates an example of a circuit configuration that compensates propagation time differences (skew) between input parallel data channels D1, D2, and D3 and an input clock channel (CLK), and synchronizes all the phases of the four channels D1, D2, D3, and CLK at the input stage of an internal synchronizing circuit. The transmitter side transmits D1, D2, D3, and CLK all in phase, however the characteristic dispersions on the propagation paths produce differences in the propagation time. As the result, the receiver side receives the clock and the data out of phase. Therefore, it is necessary to adjust the delay times between the clock and the data signals, so that the receiver side can receive the signals correctly. In the circuit shown in FIG. 2, the transmitter side transmits the special pattern (special character in 8B10B code) defined for the phase detection; the receiver side detects whether to receive the special pattern correctly (without errors) as defined, and shifts the phases of the data signals at the timing position to be received as defined. Phase shifters 1, 2, and 3 with shift the phases of the input data channels D1, D2, and D3 with the phase of a CLKP signal formed by re-timing and waveform-shaping the clock signal CLK through a phase locked loop, and send the results to code detectors 1, 2, and 3. The code detectors 1, 2, and 3 receive the data signals, and detect the errors of the received data. This embodiment varies the phase of the clock signal into four different values in one clock cycle, and controls to search the phases that the code detectors detect the correctly defined data pattern. The phases of the data signals are shifted, and the timing positions to be correctly detected are decided (in this example, the data signals are correctly received at the timing when the varied position of the internal clock CLKP comes into the center position of the data). The data signals with the timing position correctly decided get re-timing to the internal clock signal CLKP from the clock signal phase-shifted in the phase shifters 1, 2, and 3 by means of FIFO 1, 2, and 3. As the result, it becomes possible to handle the data signals D1, D2, and D3 as the parallel signals being synchronized with the internal clock signal CLKP, at the input terminals of internal logical circuits.

FIG. 3 illustrates an example of a circuit configuration that compensates propagation time differences (skew) between the input parallel data channels D1, D2, and D3, and synchronizes all the phases of the three channels. D1, D2, and D3, on the basis of a clock signal being divided from the D3 to be generated by a clock data recovery circuit CDR. The transmitter side transmits D1, D2, and D3 all in phase, however the characteristic dispersions on the propagation paths produce differences in the propagation time. As the result, the receiver side receives the clock and the data out of phase. Therefore, it is necessary to adjust the delay times between the clock and the data signals, so that the receiver side can receive the signals correctly. In the circuit shown in FIG. 3, the transmitter side transmits the special pattern (special character in 8B10B code) defined for the phase detection; the receiver side detects whether to receive the special pattern correctly (without errors) as defined, and adjusts the phases of the data signals at the timing position to be received as defined. The phase shifters 1, 2, and 3 shift the phases of the input data channels D1, D2, and D3 with the phase of the clock signal CLKP extracted from the D3, and send the results to the code detectors 1, 2, and 3. The code detectors 1, 2, and 3 receive the data signals, and detect the errors of the received data. This embodiment varies the phase of the clock signal CLKP into four different values in one clock cycle, and controls to search the phases that the code detectors detect the correctly defined data pattern. The phases of the data signals are shifted, and the timing positions to be correctly detected are decided (in this example, the data signals are correctly received at the timing when the varied position of the internal clock CLKP comes into the center position of the data). The data signals with the timing position correctly decided get re-timing to the internal clock signal CLKP from the clock signal phase-shifted in the phase shifters 1, 2, and 3 by means of the FIFO 1, 2, and 3. As the result, it becomes possible to handle the data signals D1, D2, and D3 as the parallel signals being synchronized with the internal clock signal CLKP, at the input terminals of the internal logical circuits.

Figure 1:
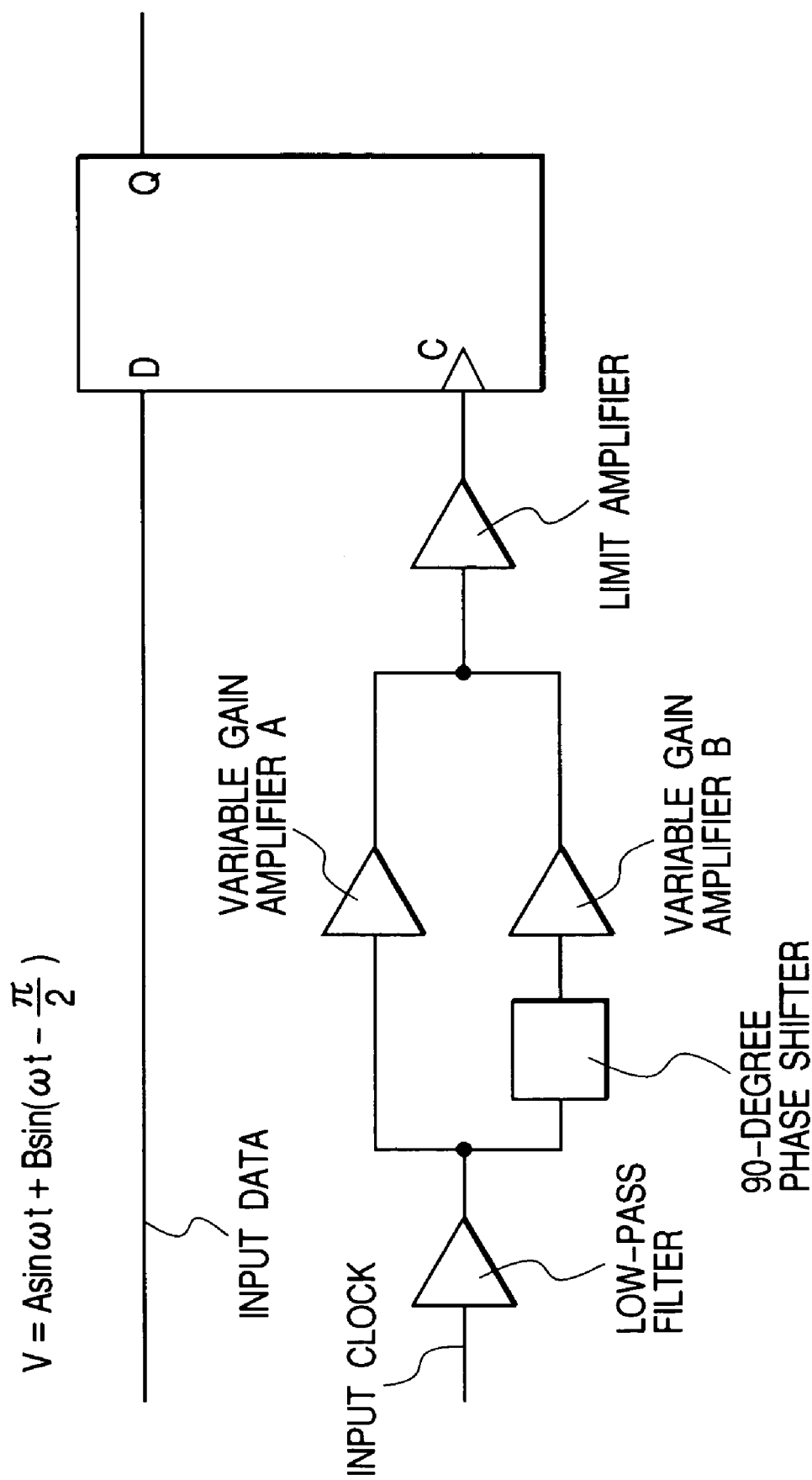
FIG. 1 is a circuit diagram illustrating the circuit configuration of a phase shifter based on the present invention.

FIG. 1 illustrates the circuit configuration of the phase shifter used in FIG. 2 or FIG. 3.

Figure 4:
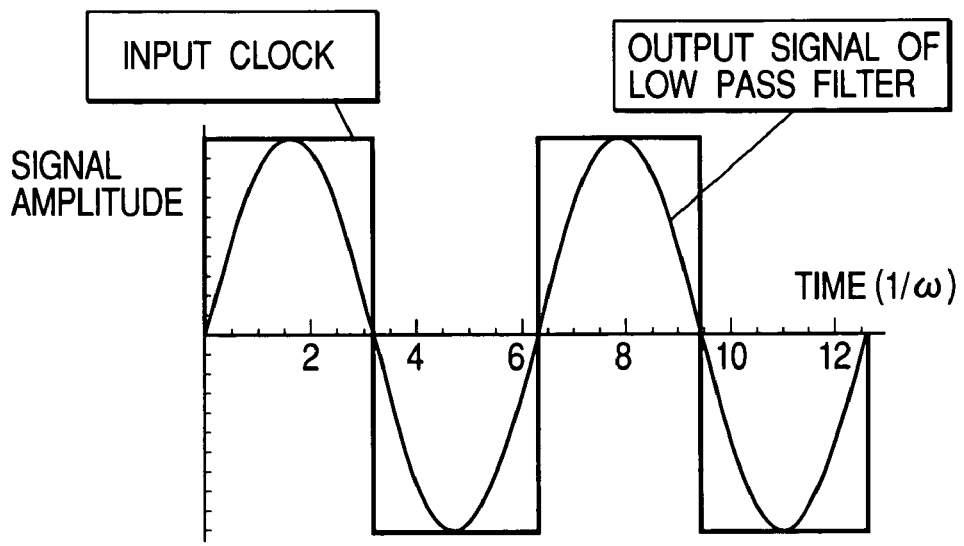
FIG. 4 is a waveform chart of the input clock and output clock of the low-pass filter inside the phase shifter based on the invention.

FIG. 4 illustrates the waveform of the input clock and output clock of the low-pass filter inside the phase shifter in FIG. 1.

Figure 5:
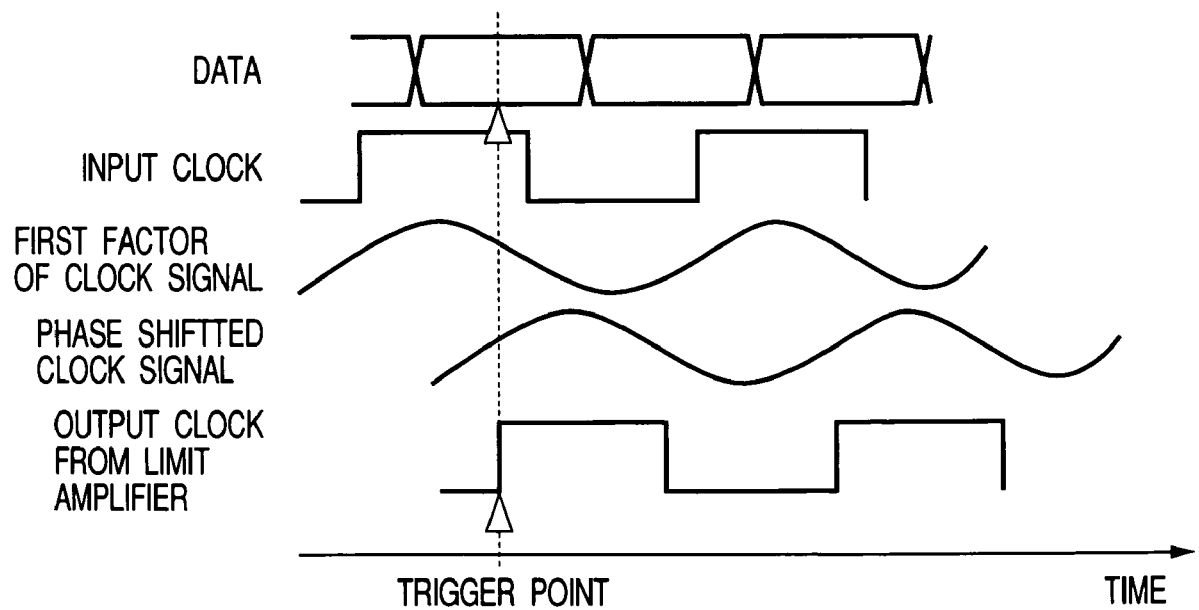
FIG. 5 is a waveform chart of signals at each stage inside the phase shifter based on the invention.

FIG. 5 illustrates the waveforms of signals at each stage inside the phase shifter in FIG. 1.

Figure 6:
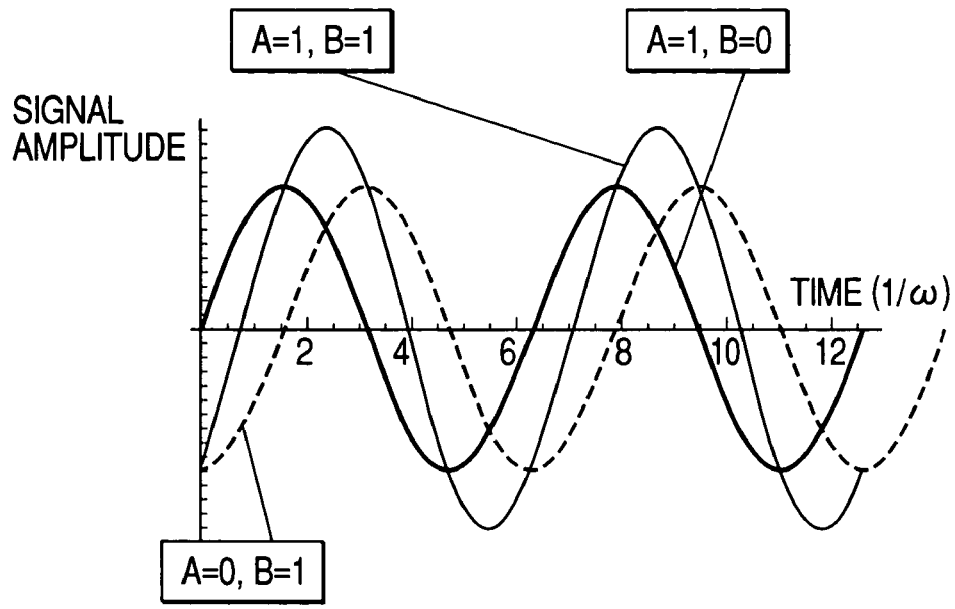
FIG. 6 is a waveform chart of the input signal to a limit amplifier inside the phase shifter based on the invention, in which the outputs from variable gain amplifiers are adjusted to three levels.

FIG. 6 illustrates the waveforms of the input signal to the limit amplifier inside the phase shifter in FIG. 1. The outputs from the variable gain amplifiers are adjusted to three levels.

In the embodiment shown in FIG. 1, the analog circuit composed of amplifiers shifts the phase of the clock signal with those of the data signals. As shown in FIG. 5, this embodiment uses the rise and fall edges of the clock signal. This circuit shifts the phase of the based frequency factor (first order factor) of the clock signal by means of analog circuits, shapes the waveform of the clock signal into rectangular waveforms by means of a limit amplifier, and synchronizes the phase between the data and the clock. In the embodiment shown in FIG. 1, higher frequency factors of the input clock signal than the frequency of the base clock signal are eliminated by the low-pass filter, as shown in FIG. 4, (the base clock signal is a sine wave of 5 giga Hz). The sine wave of 5 giga Hz is dividedly to two paths, and one of the divided signals is inputted directly to a variable gain amplifier A. The other one is 90° phase-shifted (equivalent to 50 picoseconds of delay), and is inputted to a variable gain amplifier B. The outputs from the variable gain amplifiers A and B are added at the input of the limit amplifier, and the limit amplifier converts the input sine waves into rectangular waves. The output from the limit amplifier is variable depending on the adjustment of the output gain from the variable gain amplifiers A and B.

FIG. 6 illustrates the waveforms of the input signal to the limit amplifier. The amplitude of the input signal is expressed as follows.

$$V = A \cdot \sin(\omega t) + B \cdot \sin(\omega t - \pi/2)$$

Here, A, B represent the output amplitudes of the variable gain amplifiers A, B; ω the angular velocity of the based frequency; t the time; and V the amplitude of the signal. In FIG. 6, the notation of A=1, B=0 shows that the output from the variable gain amplifier A is controlled to ON (the maximum output), and the output from the variable gain amplifier B is controlled to zero (no amplification operation). The notation of A=1, B=1 shows that both the outputs from the variable gain amplifiers A and B are controlled to ON (the maximum output). The notation of A=0, B=1 shows that the output from the variable gain amplifier A is controlled to OFF (no amplification operation) and the output from the variable gain amplifier B is controlled to ON (the maximum output). FIG. 6 shows that to adjust the outputs from the two variable gain amplifiers will shift the output waveforms of the sine wave (also fluctuate the amplitudes).

Figure 7:
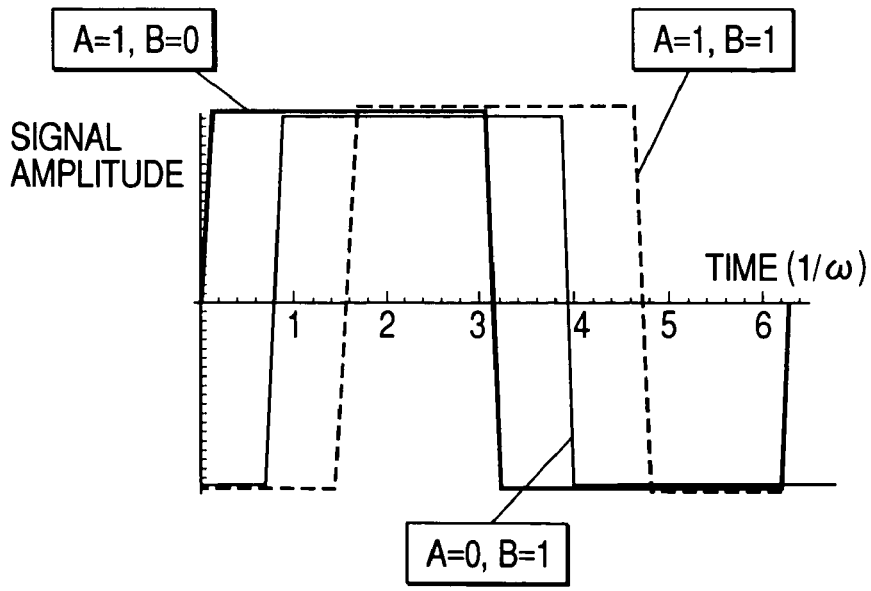
FIG. 7 is a waveform chart of the output signal from the limit amplifier inside the phase shifter based on the invention, in which the outputs from the variable gain amplifiers are adjusted to three levels.

FIG. 7 illustrates the waveforms of the output signal from the limit amplifier inside the phase shifter of the invention. Here, the outputs from the variable gain amplifiers are adjusted to three levels.

Figure 8:
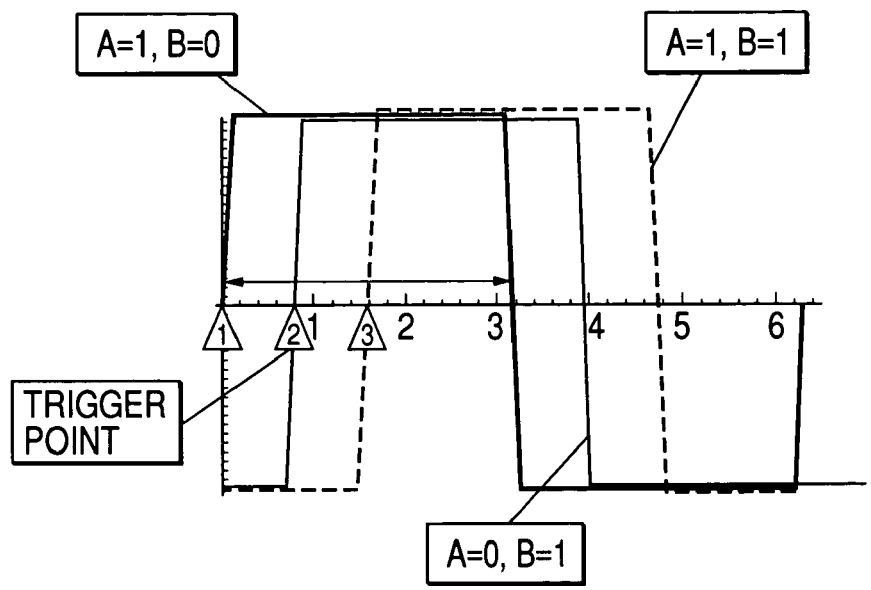
FIG. 8 is a waveform chart of the output signal from the limit amplifier inside the phase shifter based on the invention, in which the outputs from the variable gain amplifiers are adjusted to three levels, and three trigger points are indicated.

FIG. 8 illustrates the waveforms of the output signal from the limit amplifier inside the phase shifter of the invention. Here, the outputs from the variable gain amplifiers are adjusted to three levels, and three trigger points are indicated.

Inputting the signal shown in FIG. 6, the limit amplifier converts the input signal into the rectangular waveforms shown in FIG. 7. As shown in FIG. 7, the clock signal of the rectangular waveforms is generated at the timings being dislocated at three phases of 0°, 45°, and 90°, according to the output adjustment values of the two variable gain amplifiers (trigger points 1, 2, and 3, see FIG. 8). The system of this embodiment prepares three trigger points within one clock cycle (from 0° to 180°), selects the timing where the reception error is not created among the three trigger points, and thereby realizes the function for the post-stage synchronizing circuit to output.

Figure 9:
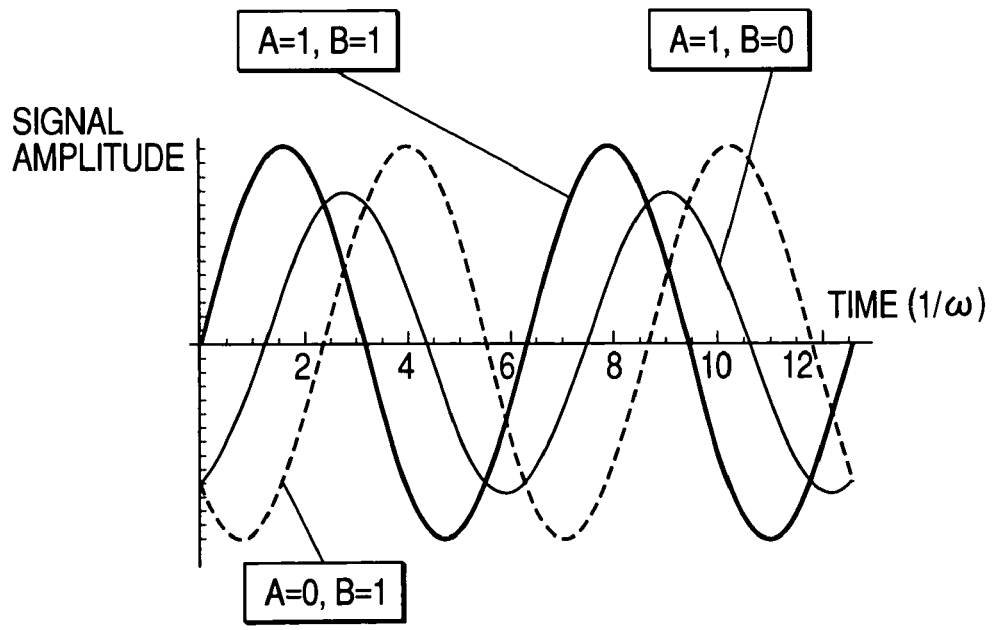
FIG. 9 is a waveform chart of the output signal to the limit amplifier inside the phase shifter based on the invention, in which the outputs from the variable gain amplifiers are adjusted to three levels, and a 90° phase shifter has the error of +50% in the phase adjustment.
Figure 10:
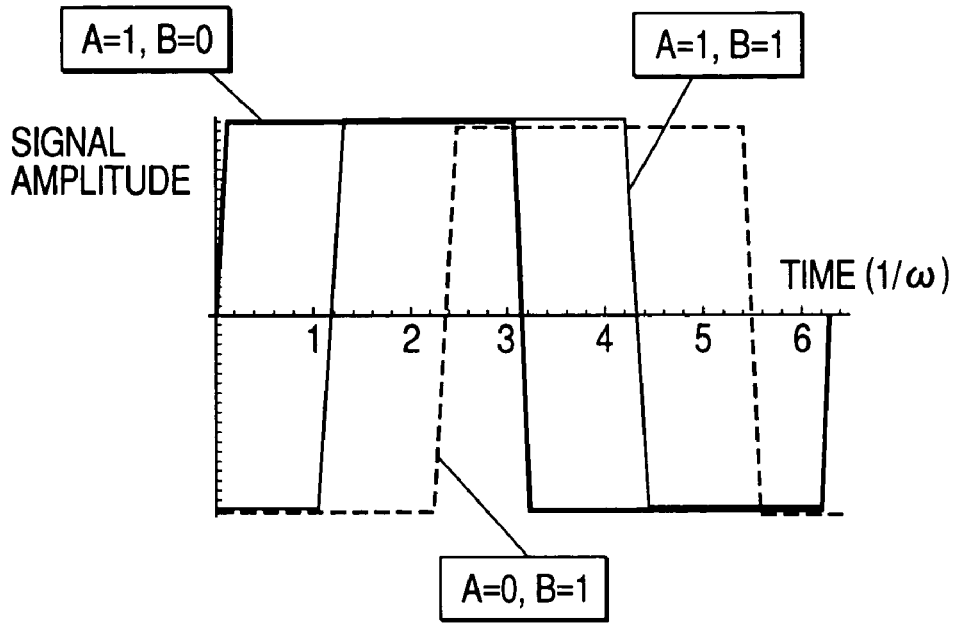
FIG. 10 is a waveform chart of the output signal from the limit amplifier inside the phase shifter based on the invention, in which the outputs from the variable gain amplifiers are adjusted to three levels, and the 90° phase shifter has the error of +50% in the phase adjustment, with three trigger points indicated.

FIG. 9 and FIG. 10 illustrate the input and the output waveforms of the limit amplifier, when the phase adjustment accuracy of the 90-degree phase shifter has the error of +50% (when the phase setting of 90° is turned into the phase of 135°) in the phase shifting system mentioned in this embodiment 1. As compared with the embodiment in FIG. 6 and FIG. 7, although the trigger points are dislocated, the clock signal is generated at the timings being dislocated at three phases of 0°, about 67.5°, and about 135°. Although not having a completely uniform cycle, the phase shifting system divides one clock cycle (from 0° to 180°) into three. In the same manner as the embodiment shown in FIG. 6 and FIG. 7, the phase shifting system accomplishes the function capable of observing the special character without errors during the three-time observations thereof as the example shown in FIG. 6. This result shows that the phase shifting accuracy of the 90-degree phase shifter may well be as coarse as about +50%, in order to achieve the three-time measurements within one clock cycle, which are not necessarily made with a uniform cycle. This also confirms that the tolerance of fabrication of the circuit constants can be relieved in the actual production of the circuit, which is very advantageous to the production of the high-speed circuits that are difficult to control with a high accuracy.

Embodiment 2

The preferred embodiment will be described in detail with reference to the accompanying drawings. In the following embodiment, the descriptions will be made with concrete numerical values for a quick understanding, however these numerical values are only for examples, and naturally these values will not restrict the invention at all.

FIG. 2 illustrates an example of a circuit configuration that compensates propagation time differences (skew) between input parallel data channels D1, D2, and D3 and an input clock channel (CLK), and synchronizes all the phases of the four channels D1, D2, D3, and CLK at the input stage of an internal synchronizing circuit. The transmitter side transmits D1, D2, D3, and CLK all in phase, however the characteristic dispersions on the propagation paths produce differences in the propagation time. As the result, the receiver side receives the clock and the data out of phase. Therefore, it is necessary to adjust the delay times between the clock and the data signals, so that the receiver side can receive the signals correctly. In the circuit shown in FIG. 2, the transmitter side transmits the special pattern (special character in 8B10B code) defined for the phase detection; the receiver side detects whether to receive the special pattern correctly (without errors) as defined, and shifts the phases of the data signals at the timing position to be received as defined. Phase shifters 1, 2, and 3 with shift the phases of the input data channels D1, D2, and D3 with the phase of a CLKP signal formed by re-timing and waveform-shaping the clock signal CLK through a phase locked loop, and send the results to code detectors 1, 2, and 3. The code detectors 1, 2, and 3 receive the data signals, and detect the errors of the received data. This embodiment varies the phase of the clock signal into four different values in one clock cycle, and controls to search the phases that the code detectors detect the correctly defined data pattern. The phases of the data signals are shifted, and the timing positions to be correctly detected are decided (in this example, the data signals are correctly received at the timing when the varied position of the internal clock CLKP comes into the center position of the data). The data signals with the timing position correctly decided get re-timing to the internal clock signal CLKP from the clock signal phase-shifted in the phase shifters 1, 2, and 3 by means of FIFO 1, 2, and 3. As the result, it becomes possible to handle the data signals D1, D2, and D3 as the parallel signals being synchronized with the internal clock signal CLKP, at the input terminals of internal logical circuits.

Figure 11:
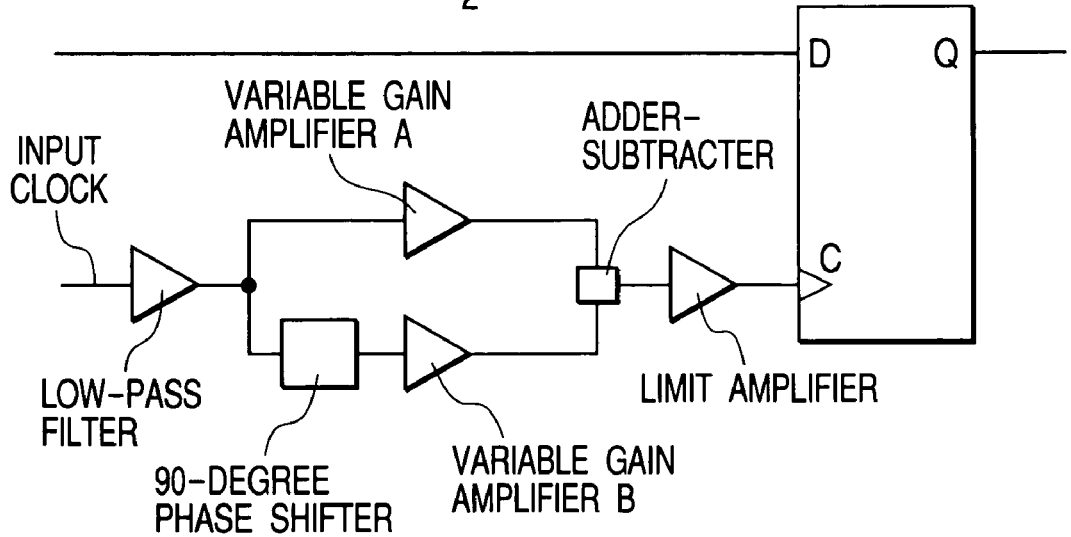
FIG. 11 is a circuit diagram illustrating the circuit configuration of a phase shifter based on the invention, in which the outputs from the variable gain amplifiers are processed by an adder-subtracter.

FIG. 11 illustrates the circuit configuration of a phase shifter based on the invention. In this embodiment, the analog circuit composed of amplifiers shifts the phase of the clock signal with those of the data signals. Higher frequency factors of the input clock signal than the frequency of the base clock signal are eliminated by the low-pass filter. Since this embodiment uses the rise and fall edges of the clock signal of 10 gigabits per second, the base clock signal is a sine wave of 5 giga Hz. The sine wave of 5 giga Hz is divided to two paths, and one of the divided signals is inputted directly to the variable gain amplifier A. The other one is 90° phase-shifted (equivalent to 50 picoseconds of delay), and is inputted to the variable gain amplifier B. The outputs from the variable gain amplifiers A and B experience an adder-subtracter, which are inputted to the limit amplifier, and the limit amplifier converts the input sine waves into rectangular waves. The adder-subtracter is operational, by switching the mode that adds the output VA of the variable gain amplifier A and the output VB of the variable gain amplifier B to output (VA+VB), and the mode that subtracts the output VA of the variable gain amplifier A from the output VB of the variable gain amplifier B to output (VB−VA) The output from the limit amplifier is variable depending on the adjustment of the output gain from the variable gain amplifiers A and B.

Figure 12:
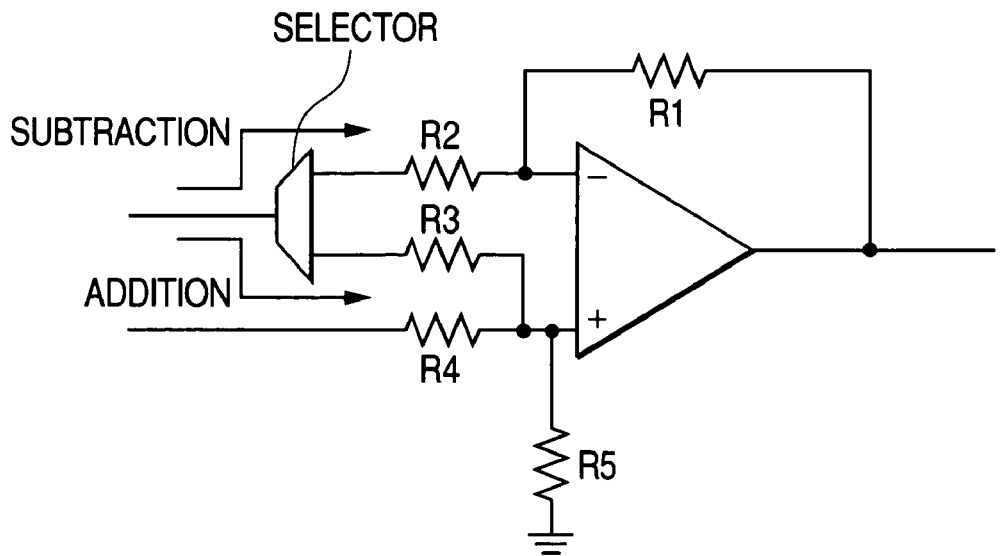
FIG. 12 is a circuit diagram inside the adder-subtracter that processes the outputs from the variable gain amplifiers based on the invention.

FIG. 12 illustrates the circuit configuration of the adder-subtracter. The adder-subtracter is composed of a differential amplifier with balanced inputs, and to switch the control signal to the selector will make it possible to switch the adding and subtracting functions. When the selector selects the adding function, the input terminal of the resistor R2 has 0 volt applied. When the selector selects the subtracting function, the input terminal of the resistor R3 has 0 volt applied.

Figure 13:
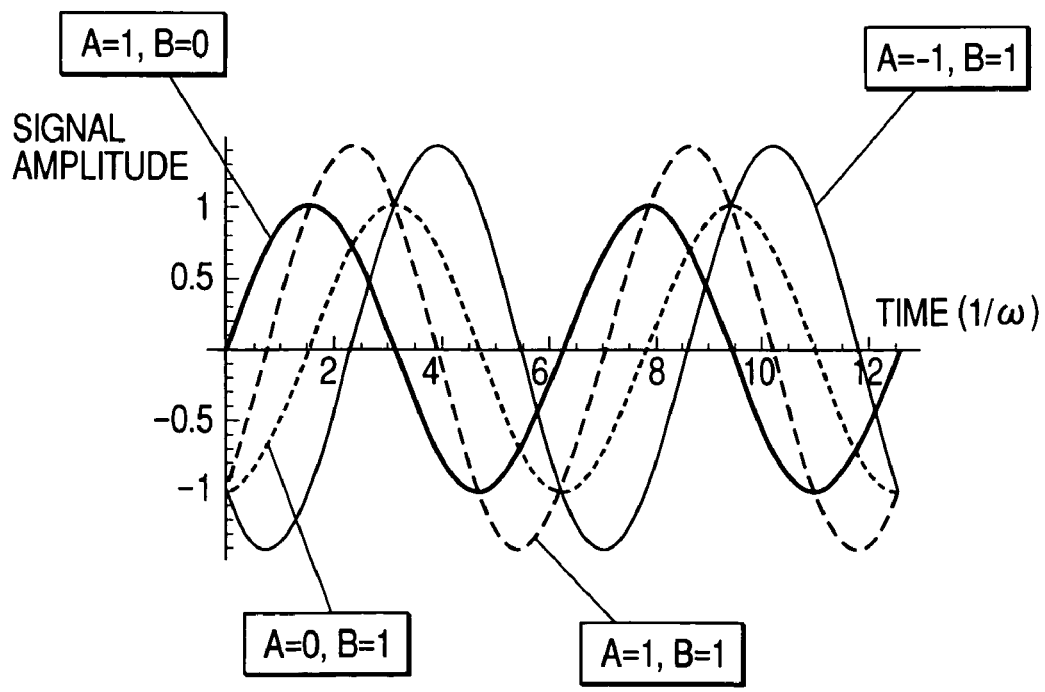
FIG. 13 is a waveform chart of the input signal to a limit amplifier inside the phase shifter illustrated in FIG. 11 and FIG. 12.

FIG. 13 illustrates the waveforms of the input signal to the limit amplifier. Here, the outputs from the variable gain amplifiers are adjusted to four levels. The amplitude of the input signal is expressed as follows.

$$V = A \cdot \sin(\omega t) + B \cdot \sin(\omega t - \pi/2)$$

Here, A, B represent the output amplitudes of the variable gain amplifiers A, B; ω the angular velocity of the based frequency; t the time; and V the amplitude of the signal. In FIG. 13, the notation of A=1, B=0 shows that the output from the variable gain amplifier A is controlled to ON (the maximum output) and the output from the variable gain amplifier B is controlled to zero (no amplification operation). The notation of A=1, B=1 shows that both the outputs from the variable gain amplifiers A and B are controlled to ON (the maximum output), and both the outputs from the variable gain amplifiers A and B are added. The notation of A=0, B=1 shows that the output from the variable gain amplifier A is controlled to OFF (no amplification operation), and the output from the variable gain amplifier B is controlled to ON (the maximum output). The notation of A=−1, B=1 shows that both the outputs from the variable gain amplifiers A and B are controlled to ON (the maximum output), and the output of the variable gain amplifier A is subtracted from the output of the variable gain amplifier B.

Figure 14:
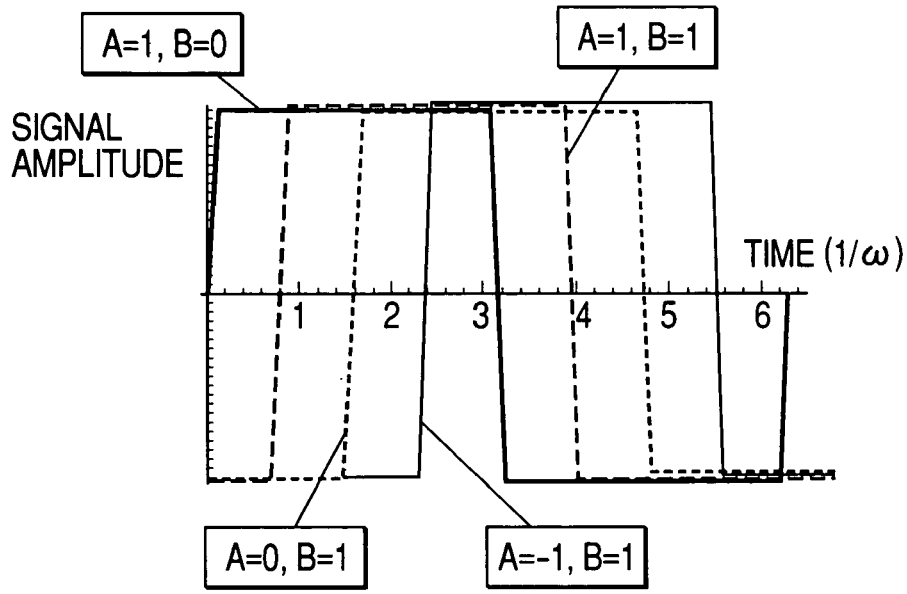
FIG. 14 is a waveform chart of the output signal from the limit amplifier inside the phase shifter illustrated in FIG. 11 and FIG. 12.

FIG. 13 shows that to adjust the outputs from the two variable gain amplifiers will shift the output waveforms of the sine wave (also fluctuate the amplitudes). Inputting the signal shown in FIG. 13, the limit amplifier converts the input signal into the rectangular waveforms shown in FIG. 14. In FIG. 14, the outputs from the variable gain amplifiers are adjusted to four levels. As shown in FIG. 14, the clock signal of the rectangular waveforms is generated at the four timings being dislocated at four phases of 0°, 45°, 90°, and 135°, according to the output adjustment values of the two variable gain amplifiers.

Figure 15:
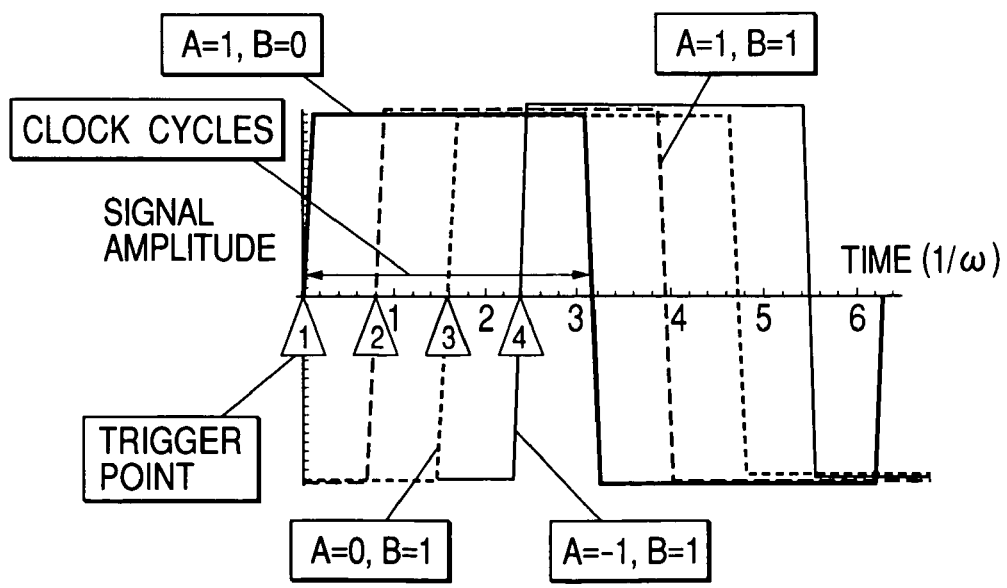
FIG. 15 is a waveform chart of the output signal from the limit amplifier inside the phase shifter illustrated in FIG. 11 and FIG. 12, and four trigger points are indicated.

FIG. 15 illustrates the output waveforms of the limit amplifier inside the phase shifter in FIG. 11 and FIG. 12, in which four trigger points are indicated, and the outputs from the variable gain amplifiers are adjusted to four levels. The system of this embodiment prepares four trigger points within one clock cycle (from 0° to 180°), selects the timing where the reception error is not created among the four trigger points, and thereby realizes the function for the post-stage synchronizing circuit to output.

Further, adjustments of the outputs from both the variable gain amplifiers A and B to the three levels of OFF, half the maximum output, and the maximum output, and combinations of these will allow still finer adjustments at 8 phases.

Figure 16:
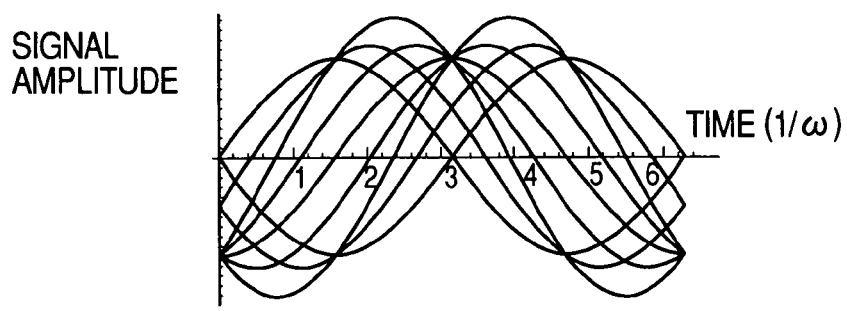
FIG. 16 is a waveform chart of the input signal to the limit amplifier inside the phase shifter illustrated in FIG. 11 and FIG. 12.

FIG. 16 illustrates the waveforms of the input signal to the limit amplifier. Here, the outputs from the variable gain amplifiers are adjusted to 8 levels. The amplitude of the input signal is expressed as follows.

$$V = A \cdot \sin(\omega t) + B \cdot \sin(\omega t - \pi/2)$$

Here, A, B represent the output amplitudes of the variable gain amplifiers A, B; ω the angular velocity of the based frequency; t the time; and V the amplitude of the signal. Now, by controlling the output amplitudes of the two variable gain amplifiers into the following 8 levels, the phase can be controlled at 8 phases within one clock cycle. Here, 1 signifies the maximum output, 0.5 half the maximum output, 0 OFF output, and the positive sign indicates the adding operation of the adder-subtracter, the negative sign the subtracting operation thereof.

(1) A=1, B=0

(2) A=1, B=0.5

(3) A=1, B=1

(4) A=0.5, B=1

(5) A=0, B=1

(6) A=−0.5, B=1

(7) A=−1, B=1

(8) A=−1, B=0.5

Figure 17:
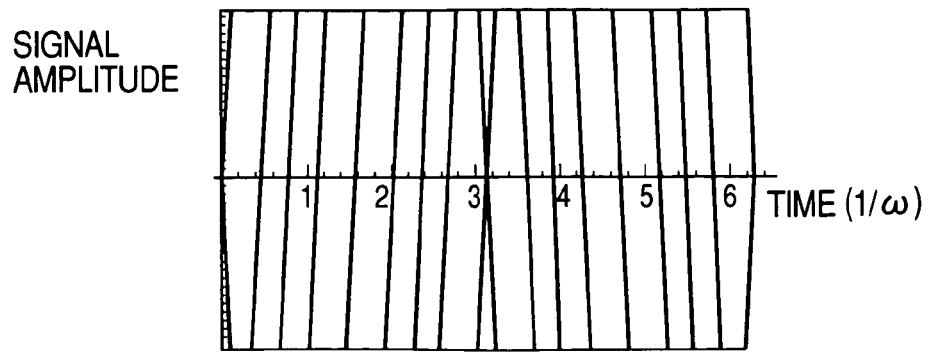
FIG. 17 is a waveform chart of the output signal from the limit amplifier inside the phase shifter illustrated in FIG. 11 and FIG. 12.

FIG. 16 shows that to adjust the outputs from the two variable gain amplifiers will shift the output waveforms of the sine wave (also fluctuate the amplitudes) Inputting the signal shown in FIG. 16, the limit amplifier converts the input signal into the rectangular waveforms shown in FIG. 17. FIG. 17 shows the case in which the outputs from the variable gain amplifiers are adjusted to 8 levels. As shown in FIG. 17, the clock signal of the rectangular waveforms is generated at the 8 timings being dislocated at 8 phases within one clock cycle from 0° to 180°, according to the output adjustment values of the two variable gain amplifiers. To still more minutely control the output values of the variable gain amplifiers will allow a further accurate phase control.

Embodiment 3

Figure 18:
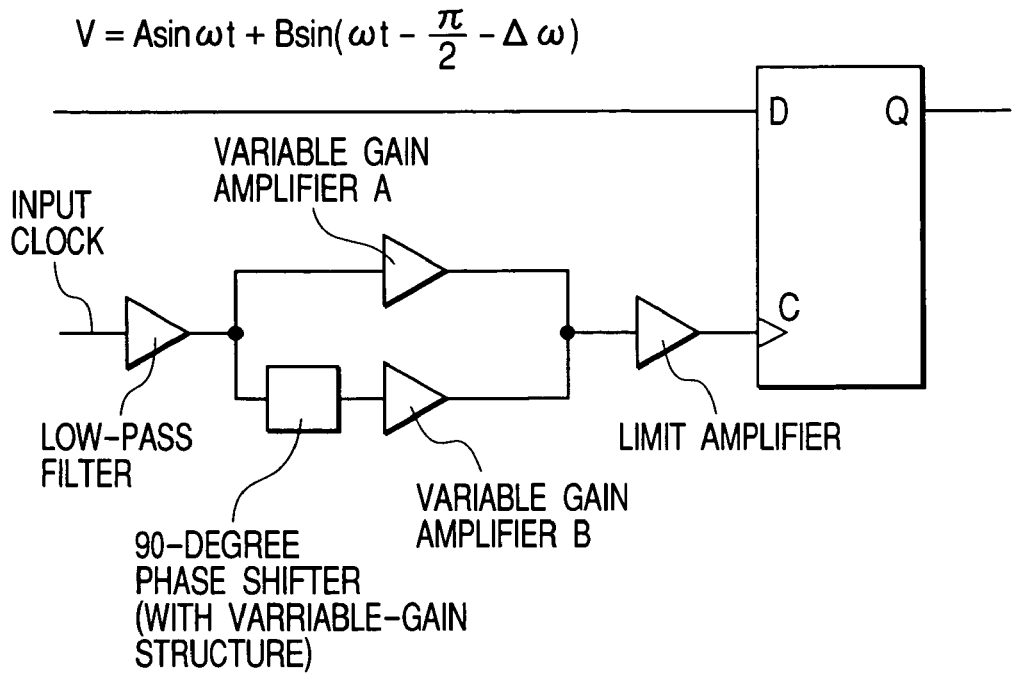
FIG. 18 is a circuit diagram of a phase shifter incorporating a fine phase arrangement system, which is a replacement for the phase shifter having the fixed phase adjustment function illustrated in FIG. 1.

This embodiment is related with the skew compensation system for high-speed parallel signaling mentioned in the embodiment 1, which adopts a circuit configuration illustrated in FIG. 18 as an internal circuit of the phase shifter in replacement for the one illustrated in FIG. 1. The phase shifter illustrated in FIG. 18 incorporates a valuable phase adjustment system into the 90-degree phase shifter. A modification of the initial phase shift of 90° into that of 135°, for example, will realize the following operation that allows adjusting the time cycles of the phase adjustment, which cannot be achieved in the embodiment 1.

FIG. 9 illustrates the waveforms of the input signal to the limit amplifier. The amplitude of the input signal is expressed as follows.

$$V = A \cdot \sin(\omega t) + B \cdot \sin(\omega t - 3\pi/4)$$

Here, A, B represent the output amplitudes of the variable gain amplifiers A, B; ω the angular velocity of the based frequency; t the time; and V the amplitude of the signal. In FIG. 9, the notation of A=1, B=0 shows that the output from the variable gain amplifier A is controlled to ON (the maximum output), and the output from the variable gain amplifier B is controlled to zero (no amplification operation). The notation of A=1, B=1 shows that both the outputs from the variable gain amplifiers A and B are controlled to ON (the maximum output). The notation of A=0, B=1 shows that the output from the variable gain amplifier A is controlled to OFF (no amplification output), and the output from the variable gain amplifier B is controlled to ON (the maximum output). FIG. 9 shows that to adjust the outputs from the two variable gain amplifiers will shift the output waveforms of the sine wave (also fluctuate the amplitudes) Inputting the signal shown in FIG. 9, the limit amplifier converts the input signal into the rectangular waveforms shown in FIG. 10. As shown in FIG. 10, the clock signal of the rectangular waveforms is generated at the timings being dislocated at three phases of 0°, 67.5°, and 135°, according to the output adjustment values of the two variable gain amplifiers. The system of this embodiment prepares three trigger points within one clock cycle (from 0° to 180°), selects the timing where the reception error is not created among the three trigger points, and thereby realizes the function for the post-stage synchronizing circuit to output.

Embodiment 4

Figure 19:
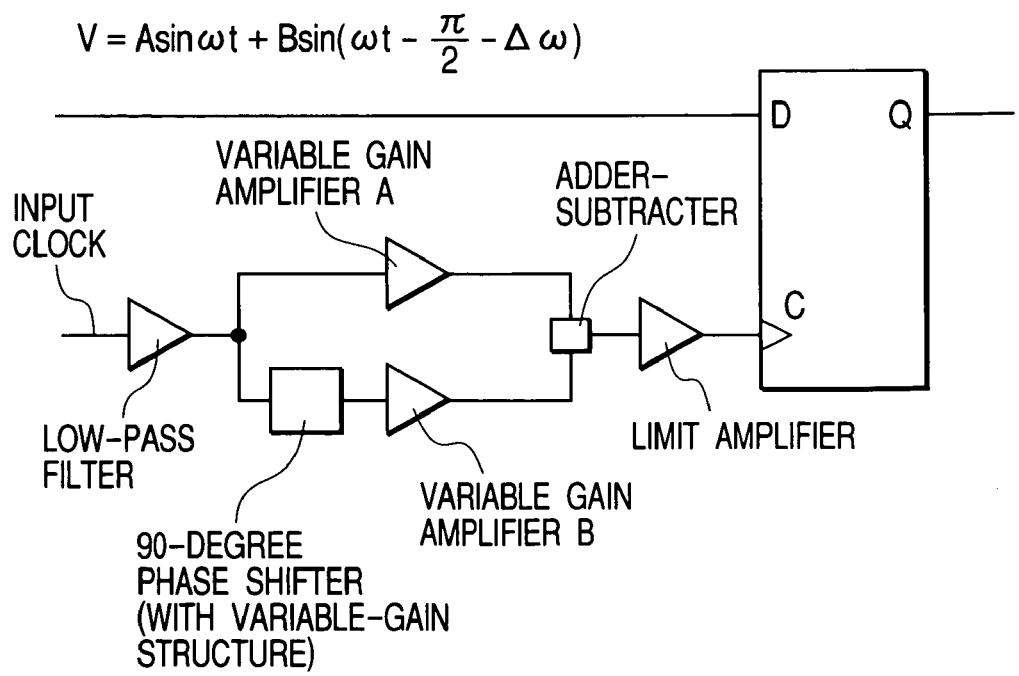
FIG. 19 is a circuit diagram of a phase shifter incorporating a fine phase arrangement system, which is a replacement for the phase shifter having the fixed phase adjustment function illustrated in FIG. 11.

This embodiment is related with the skew compensation system for high-speed parallel signaling mentioned in the embodiment 2, which is illustrated in FIG. 19. The phase shifter illustrated in FIG. 19 incorporates a fine arrangement system of the phase into the 90-degree phase shift element, which makes it possible to adjust a dislocated phase, when the phase is shifted from the defined 90° due to the temperature change of the operational environments and/or the dispersions on the production.

Introducing the arrangement system will permit the skew compensation system to handle a variable frequency. The cycle of the signal of 1 gigabit per second is 2 nanoseconds. Therefore, by incorporating a circuit capable of a delay time adjustment covering from 500 picoseconds being ¼ of 2 nanoseconds to 50 picoseconds into the arrangement system, this embodiment achieves a phase shifter that is needed to an arbitrary frequency from 1 gigabit per second to 10 gigabits per second in the embodiment 2.

According to the invention, the skew adjustment between the clock signal and the data signal required for the parallel synchronous transmission of high-speed signals as fast as 10 gigabits per second can be achieved with a high accuracy of some picoseconds and a downsized circuit scale advantageous to the high-density integration. Thereby, it becomes possible to easily shift at the receiving side the phases of the parallel synchronizing signals composed of multiple channels of high-speed data of 10 gigabits per second in parallel. Further, by incorporating the fine arrangement system of the phase into the 90-degree phase shifter that is provided in the internal circuit, the phase shifter can compensate the errors from the 90-degree phase due to the dispersions of transistor characteristics. And, by expanding the fine adjustment amount, the phase shifter become capable of handling a variable frequency.

It is further understood by those skilled in the art that the foregoing description is a preferred embodiment of the disclosed device and that various changes and modifications may be made in the invention without departing from the spirit and scope thereof.

What is claimed is:

1. A phase shifter for shifting a phase relation between a clock signal and a data signal, the phase shifter comprising:
   a first filter that inputs at least one of the clock signal and the data signal to be phase-shifted;
   a first signal path and a second signal path that divide an output signal from the first filter to input divided signals;
   a phase shift element that gives different phases to one of the divided signals on the first signal path and another of the divided signals on the second signal path;
   a first variable gain amplifier located on the first signal path;
   a second variable gain amplifier located on the second signal path;
   an adder-subtractor that executes an operation to an output from the first variable gain amplifier and an output from the second variable gain amplifier;
   a second filter that inputs an output from the adder-subtractor; and
   control means that adjusts at least one output of the first and second variable gain amplifiers to thereby adjust the phase of the output from the second filter.

2. The phase shifter according to claim 1, wherein the first filter is a low-pass filter that passes low frequency factors of an input signal.

3. The phase shifter according to claim 2, wherein the first filter is the low pass filter that eliminates higher-order frequency factors of the input signal than the frequency of a base clock signal.

4. The phase shifter according to claim 1, wherein the phase shifter element is a 90-degree phase shifter that gives the a 90° phase shift to an input signal.

5. The phase shifter according to claim 1, wherein the adder-subtractor executes addition or subtraction to input signals.

6. The phase shifter according to claim 1, wherein the second filter is a limit amplifier that converts a signal having a low frequency factor of an input signal or a signal having a frequency equal to the frequency of a base clock signal into a rectangular wave signal.

7. The phase shifter according to claim 1, wherein all the circuits are comprised of analog circuits.

8. A skew compensation system used for high-speed parallel signaling, wherein the skew compensation system shifts phase differences between a high-speed synchronized clock signal and parallel data signals, the skew compensation system comprising:
a phase shifting circuit located on a receiver side for controlling phase differences between the clock signal and the parallel data signals; wherein a special data pattern defined to be used is transmitted when a synchronized data transmission cannot be realized because of a skew between parallel data lines being not yet adjusted on the receiver side or before transmitting the data signals every constant time cycle from a transmitter side; and wherein the phase shifting circuit receives signals outputted from a transmitter side circuit to detect errors of the signals to the defined special data pattern, and compensates the skew between the clock signal and the data signals on basis of a result of the detection at the receiver side so that a phase relation for receiving the special data pattern correctly at the receiver side is obtained, and
a circuit that the phase shifting circuit has,
wherein the circuit, in order to shifts the phase of either of the clock signal or the parallel data signals by dividing the phase for one cycle of the base frequency of the synchronized clock signal into time cycles of x units (x: integer not less than 2) with even time cycle or uneven time cycle to compensate the skew, executes a filtering processing to one of the clock signal or the data signals through a band pass filter having a pass band not higher than the base frequency of the synchronized clock signal, divides the filtered signal into plural signals of more than or equal to two, inputs the signals after being divided to phase shifter elements each having different propagation delay characteristics, inputs signals from the phase shifter elements to different variable gain amplifiers respectively, after adding outputs from the variable gain amplifiers, inputs a signal after being added to a limit amplifier having a pass band characteristic sufficiently higher than the based frequency of the synchronized clock signal to reshape the waveform of the signal after being added into a rectangular wave, and inputs a signal after being reshaped to a flip-flop circuit together with the parallel data signals or the clock signal paired with the reshaped signal to execute a re-timing processing, and
wherein the phase shifting circuit, by individually adjusting the outputs from the plural variable gain amplifiers incorporated in the circuit, shifts the phases of the output signals from the limit amplifier of the data signals or the clock signal to be phase-shifted to x levels with the signal factors retained intact, and realizes shifting the phase differences between the clock signal and the data signals by using the above phase-shifting function.

9. A skew compensation system used for high-speed parallel signaling, wherein the skew compensation system shifts phase differences between a high-speed synchronized clock signal and parallel data signals, the skew compensation system comprising:
a first circuit located on a receiver side for controlling phase differences between the clock signal and the parallel data signals; wherein a special data pattern defined to be used is transmitted when a synchronized data transmission cannot be realized because of a skew between parallel data lines being not yet adjusted on the receiver side or before transmitting the data signals every constant time cycle from a transmitter side; and wherein the first circuit receives signals outputted from a transmitter side circuit to detect errors of the signals to the defined special data pattern, and adjusts the phase differences between the clock signal and the data signals on basis of a result of the detection at the receiver side of the data so that a phase relation for receiving the special data pattern correctly at the receiver side is obtained, and
a second circuit that the first circuit has,
wherein the second circuit, in order to shifts the phase of either of the clock signal or the data signals by dividing the phase for one cycle of the base frequency of the synchronized clock signal into time cycles of x units (x: integer not less than 2) with even time cycle or uneven time cycle, executes a filtering processing to one of the clock signal or the data signals through a band pass filter having a pass band not higher than the base frequency of the synchronized clock signal, divides the filtered signal into plural signals of more than or equal to two, inputs the signals after being divided to phase shifter elements each having different propagation delay characteristics, inputs signals from the phase shifter elements to different variable gain amplifiers respectively, after adding or subtracting outputs from the variable gain amplifiers by means of an adder-subtracter, inputs a signal after being added or subtracted to a limit amplifier to a limit amplifier having a pass band characteristic sufficiently higher than the based frequency of the synchronized clock signal to reshape the waveform of the signal after being added or subtracted into a rectangular wave, and inputs a signal after being reshaped to a flip-flop circuit together with the data signals or the clock signal paired with the reshaped signal to execute a re-timing processing, and
wherein the first circuit, by individually adjusting the outputs from the plural variable gain amplifiers incorporated in the second circuit and using to switch the adding and subtracting functions, shifts the phases of the output signals from the limit amplifier of the data signals or the clock signal to be phase-shifted to x levels with the signal factors retained intact, and realizes shifting the phase differences between the clock signal and the data signals by using the above phase-shifting function.

10. The skew compensation system according to claim 8, further comprising a circuit capable of variable adjustment as to either or both of the dividing number x of the phase shifting and the time cycle of the phase shifting.

11. The skew compensation system according to claim 8, further comprising a circuit capable of variable adjustment as to the propagation delay characteristics of all or part of the phase shifter elements located on the pre-stage of the variable gain amplifiers inside the skew compensation system.

12. The skew compensation system according to claim 8, wherein a combination of special characters of 8B10B code or 64B66B code used in the Ethernet (trademark) standard is used as the special data pattern for the skew compensation.

13. The skew compensation system according to claim 8, further comprising a circuit capable of variable adjustment as to either or both of the dividing number x of the phase shifting and the time cycle of the phase shifting.

14. The skew compensation system according to claim 9, further comprising a circuit capable of variable adjustment as to either or both of the dividing number x of the phase shifting and the time cycle of the phase shifting.

15. The skew compensation system according to claim 9, further comprising a circuit capable of variable adjustment as to the propagation delay characteristics of all or part of the phase shifter elements located on the pre-stage of the variable gain amplifiers inside the skew compensation system.

16. A skew compensation system according to claim 8, wherein a combination of special characters of 8B10B code or 64B66B code used in the Ethernet (trademark) standard is used as the special data pattern for the skew compensation.

17. A skew compensation system according to claim 9, wherein a combination of special characters of 8B10B code or 64B66B code used in the Ethernet (trademark) standard is used as the special data pattern for the skew compensation.

* * * * *